US006940765B2

(12) United States Patent
Kyung

(10) Patent No.: US 6,940,765 B2
(45) Date of Patent: Sep. 6, 2005

(54) REPAIR APPARATUS AND METHOD FOR SEMICONDUCTOR MEMORY DEVICE TO BE SELECTIVELY PROGRAMMED FOR WAFER-LEVEL TEST OR POST PACKAGE TEST

(75) Inventor: Kye-hyun Kyung, Yongin-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 10/834,490

(22) Filed: Apr. 29, 2004

(65) Prior Publication Data

US 2005/0041491 A1 Feb. 24, 2005

(30) Foreign Application Priority Data

Aug. 20, 2003 (KR) .................... 10-2003-0057512

(51) Int. Cl.[7] ............................... G11C 7/00
(52) U.S. Cl. ..................... 365/200; 365/201
(58) Field of Search ................. 265/200, 201

(56) References Cited

U.S. PATENT DOCUMENTS

| | | | |
|---|---|---|---|
| 5,576,999 A | 11/1996 | Kim et al. ............... | 365/200 |
| 6,465,261 B2 * | 10/2002 | Kang ....................... | 438/3 |
| 6,754,094 B2 * | 6/2004 | McClure ................... | 365/145 |

FOREIGN PATENT DOCUMENTS

KR   1997-003948   1/1997   ........... G11C/29/00

* cited by examiner

Primary Examiner—Michael Tran
(74) Attorney, Agent, or Firm—Mills & Onello LLP

(57) ABSTRACT

Provided are a repair apparatus and method in a semiconductor memory device, the repair apparatus being selectively programmed suitable for a wafer-level test or a post package test. The repair apparatus includes a repair control circuit, a redundancy memory cell array, and a redundancy decoder. The repair control circuit programs one of an address signal for a first defective cell of the main memory cell array and an address signal for a second defective cell of the main memory cell array and outputs a control signal in response to the address signal undergoing the first decoding operation, the first defective cell being detected during a wafer-level test and the second defective cell being detected during a post package test. The redundancy memory cell array includes a plurality of redundancy memory cells and is activated to repair one of the first and second defective cells. The redundancy decoder is enabled or disabled in response to the control signal and is enabled to activate parts of the redundancy memory cells. The normal decoder is disabled in response to the control signal when the redundancy decoder is enabled.

15 Claims, 4 Drawing Sheets

REPAIR APPARATUS AND METHOD FOR SEMICONDUCTOR MEMORY DEVICE TO BE SELECTIVELY PROGRAMMED FOR WAFER-LEVEL TEST OR POST PACKAGE TEST

BACKGROUND OF THE INVENTION

This application claims the priority of Korean Patent Application No. 2003-57512, filed on Aug. 20, 2003, in the Korean Intellectual Property Office, the contents of which are incorporated herein in their entirety by reference.

1. Field of the Invention

The present invention relates to a semiconductor memory device, and more particularly, to a repair apparatus and method for a semiconductor memory device.

2. Description of the Related Art

As semiconductor memory devices become more and more highly integrated, a process by which they are manufactured also becomes complicated. Consequently, the number of memory cells that fail due to damage during the manufacturing process increases. For this reason, most semiconductor memory devices are designed to include a small number of redundancy memory cell arrays that repair defective cells of a main memory cell array. A conventional repair apparatus for a semiconductor memory device which include such redundancy memory cell arrays is disclosed in U.S. Pat. No. 5,576,999.

A row line or a column line of a main memory cell array including at least one defective cell may be replaced with redundancy memory cells. For the replacement, the addresses of defective cells are required to be programmed in a repair control circuit of a repair apparatus before the replacement. The repair control circuit programs the addresses of the defective cells by selectively cutting fuses included in the repair control circuit. In general, the fuses are laser fuses that can be cut using a laser beam or electrical fuses that can be cut electrically.

FIG. 1 is a block diagram of a semiconductor memory device 100 including a conventional repair apparatus 150. Some internal circuits in the semiconductor memory device 100 are not illustrated in FIG. 1 for convenience. Referring to FIG. 1, the semiconductor memory device 100 includes a main memory cell array 110, a normal row decoder 120, a row address buffer 130, a row predecoder 140, and the repair apparatus 150.

The repair apparatus 150 includes a first redundancy memory cell array 151, a second redundancy memory cell array 152, a first redundancy row decoder 153, a second redundancy row decoder 154, and a repair control circuit 155. The repair control circuit 155 includes a first comparator 161, a second comparator 162, and a fuse box 163.

The first redundancy memory cell array 151, the first redundancy row decoder 153, and the first comparator 161 repair a defective cell, i.e., a first defective cell, in the main memory cell array 110 which is detected during a wafer-level test process. The second redundancy memory cell array 152, the second redundancy row decoder 154, the second comparator 162, and the fuse box 163 repair a defective cell, i.e., a second defective cell, in the main memory cell array 110 which is defected during a test, i.e., post package test, following a packaging process.

The first comparator 161 includes a plurality of fuses F1 through F24, of FIG. 2, which are programmed with the address of the first defective cell. The first comparator 161 will be described in a greater detail with reference to FIG. 2. The fuse box 163 is programmed with the address of the second defective cell.

Referring to FIG. 2, the first comparator 161 includes an address comparing circuit 91 and a logic circuit 92. The address comparing circuit 91 includes a plurality of transistors 21 through 49 and a plurality of fuses F1 through F24.

The elements of the conventional repair apparatus 150 are divided into two groups according to their functions. The elements belonging to one group are the first redundancy memory cell array 151, the first redundancy row decoder 153, and the first comparator 161. These elements repair a defective cell detected during a wafer-level test. The elements belonging to the other group are the second redundancy memory cell array 152, the second redundancy row decoder 154, the second comparator 162, and the fuse box 163. These repair a defective cell detected during a post package test. Also, the repair apparatus 150 includes the first and second redundancy memory cell arrays 151 and 152 that are used by the above two groups, respectively. The first and second redundancy memory cell arrays 151 and 152 are separated from each other, and the number of their redundancy memory cells is limited to minimize space occupied by the first and second redundancy memory cell arrays 151 and 152 in the semiconductor memory device 100.

Accordingly, the conventional repair apparatus 150 is disadvantageous in a total number of memory cells for repairing defective cells detected during the wafer-level and post package tests. Also, since signal paths of the two groups of elements are different from each other, timing control must be individually performed on the two groups of elements.

SUMMARY OF THE INVENTION

The present invention provides a repair apparatus and method in a semiconductor memory device. The repair apparatus can be selectively programmed for a wafer-level test and a post package test.

According to an aspect of the present invention, there is provided a repair apparatus in a semiconductor memory device and a semiconductor memory device including the repair apparatus. The semiconductor memory device includes a main memory cell array with a plurality of main memory cells, a predecoder which performs a first decoding operation on an external address signal, and a decoder which performs a second decoding operation on the address signal undergoing the first decoding operation and selects and activates parts of the plurality of main memory cells. The repair apparatus includes a repair control circuit, a redundancy memory cell array, and a redundancy decoder. The repair control circuit which programs one of an address signal for a first defective cell of the main memory cell array and an address signal for a second defective cell of the main memory cell array and outputs a control signal in response to the address signal undergoing the first decoding operation, the first defective cell being detected during a wafer-level test and the second defective cell being detected during a post package test. The redundancy memory cell array includes a plurality of redundancy memory cells and is activated to repair one of the first and second defective cells. The redundancy decoder is enabled or disabled in response to the control signal and is enabled to activate parts of the redundancy memory cells. The decoder is disabled in response to the control signal when the redundancy decoder is enabled.

In one embodiment, the repair control circuit comprises: a wafer repair information generator which outputs a wafer repair signal indicating whether the programmed address signal of the first defective cell is present; a fuse box which includes a plurality of first fuses and outputs the programmed address signal for the second defective cell, wherein the address signal for the second defective cell is programmed when parts of the first fuses are cut in response to an external program control signal; a controller which outputs a plurality of mode determination signals and a repair enable signal in response to the wafer repair signal and the address signal for the second defective cell; and a comparator which determines one of the address signal for the first defective cell and the address signal for the second defective cell as a reference address signal in response to the plurality of mode determination signals and the repair enable signal, compares the address signal undergoing the first decoding operation with the reference address signal, and outputs the control signal as the result of comparison. The fuse box is disabled and does not output the address signal for the second defective cell when the programmed address signal for the first defective cell is present.

The wafer repair information generator can enable the wafer repair signal when the programmed address signal for the first defective cell is present and can disable the wafer repair signal otherwise, and the controller can enable all of the plurality of mode determination signals when the wafer repair signal is enabled, and can enable parts of the plurality of mode determination signals in response to the address signal for the second defective cell, which is input from the fuse box, when the wafer repair signal is disabled.

In one embodiment, the comparator comprises: an address comparing circuit which outputs a plurality of internal signals when the address signal undergoing the first decoding operation is equivalent to the reference address signal; and a logic circuit which outputs the control signal in response to the plurality of internal signals.

In one embodiment, the address comparing circuit comprises: a plurality of second fuses connected in parallel; a plurality of first switching circuits which are connected in series between inputs of the plurality of second fuses and an output of the predecoder, respectively; and a plurality of second switching circuits which are connected in series between outputs of the plurality of second fuses and a ground voltage, respectively.

In one embodiment, the plurality of first switching circuits are turned on or off in response to the plurality of mode determination signals, the plurality of second switching circuits are turned on or off in response to the repair enable signal, and the plurality of second switching circuits are all turned off when all or parts of the first switching circuits are turned on.

In one embodiment, parts of the plurality of second fuses are cut when all of the plurality of mode determination signals are enabled, and all of the plurality of second fuses are not cut when parts of the plurality of mode determination signals are enabled.

In one embodiment, both the address signal for the first defective cell and the address signal for the second defective cell are row address signals.

In one embodiment, both the address signal for the first defective cell and the address signal for the second defective cell are column address signals. According to another aspect of the present invention, there is provided a repair method using a repair apparatus that includes a repair control circuit which programs one of an address signal for a first defective cell detected during a wafer-level test and an address signal for a second defective cell detected during a post package test and outputs a control signal in response to a decoded address signal input from a predecoder, a redundancy memory cell array which includes a plurality of redundancy memory cells, and a redundancy decoder which activates parts of the redundancy memory cells in response to the control signal. The repair method comprises: (a) determining whether an address signal programmed in the repair control circuit is the address signal for the first defective cell; (b) comparing the decoded address signal with the address signal for the first defective cell and outputting the control signal as the result of the comparison when the address signal for the first defective cell is programmed in step (a); (c) comparing the decoded address signal with the address signal for the second defective cell and outputting the control signal as the result of the comparison when the address signal for the first defective cell is not programmed in step (a); and (d) enabling the redundancy decoder and activating parts of the plurality of redundancy memory cells when the control signal is enabled.

In one embodiment, step (b) comprises: (b1) enabling all of the plurality of mode determination signals; (b2) determining that the address signal for the first defective cell as a reference address signal, which is compared with the decoded address signal, in response to the plurality of mode determination signals; (b3) comparing the address signal for the first defective signal with the decoded address signal; and (b4) enabling the control signal when it is determined in step (b3) that the address signal for the first defective cell is equivalent to the decoded address signal.

In one embodiment, step (c) comprises: (c1) enabling parts of the plurality of mode determination signals in response to the address signal for the second defective cell; (c2) determining the address signal for the second defective cell as a reference address signal, which is compared with the decoded address signal, in response to the plurality of mode determination signals; (c3) comparing the address signal for the second defective cell with the decoded address signal; and (c4) enabling the control signal when it is determined in step (c3) that the address signal for the second defective cell is equivalent to the decoded address signal.

In one embodiment, both the address signal for the first defective cell and the address signal for the second defective cell are row address signals.

In one embodiment, both the address signal for the first defective cell and the address signal for the second defective cell are column address signals.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
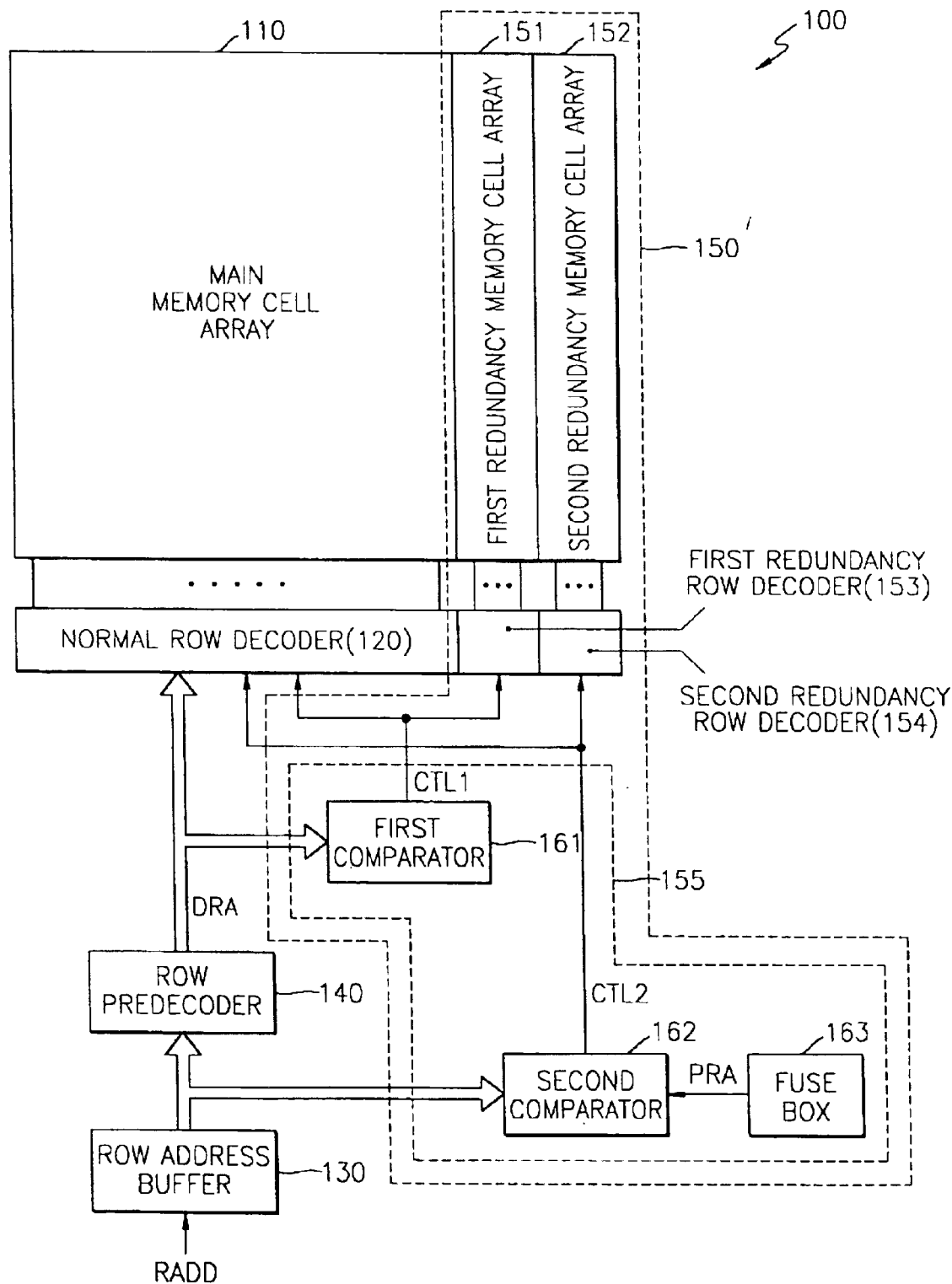
FIG. 1 is a block diagram of a semiconductor memory device with a conventional repair apparatus.
Figure 2:
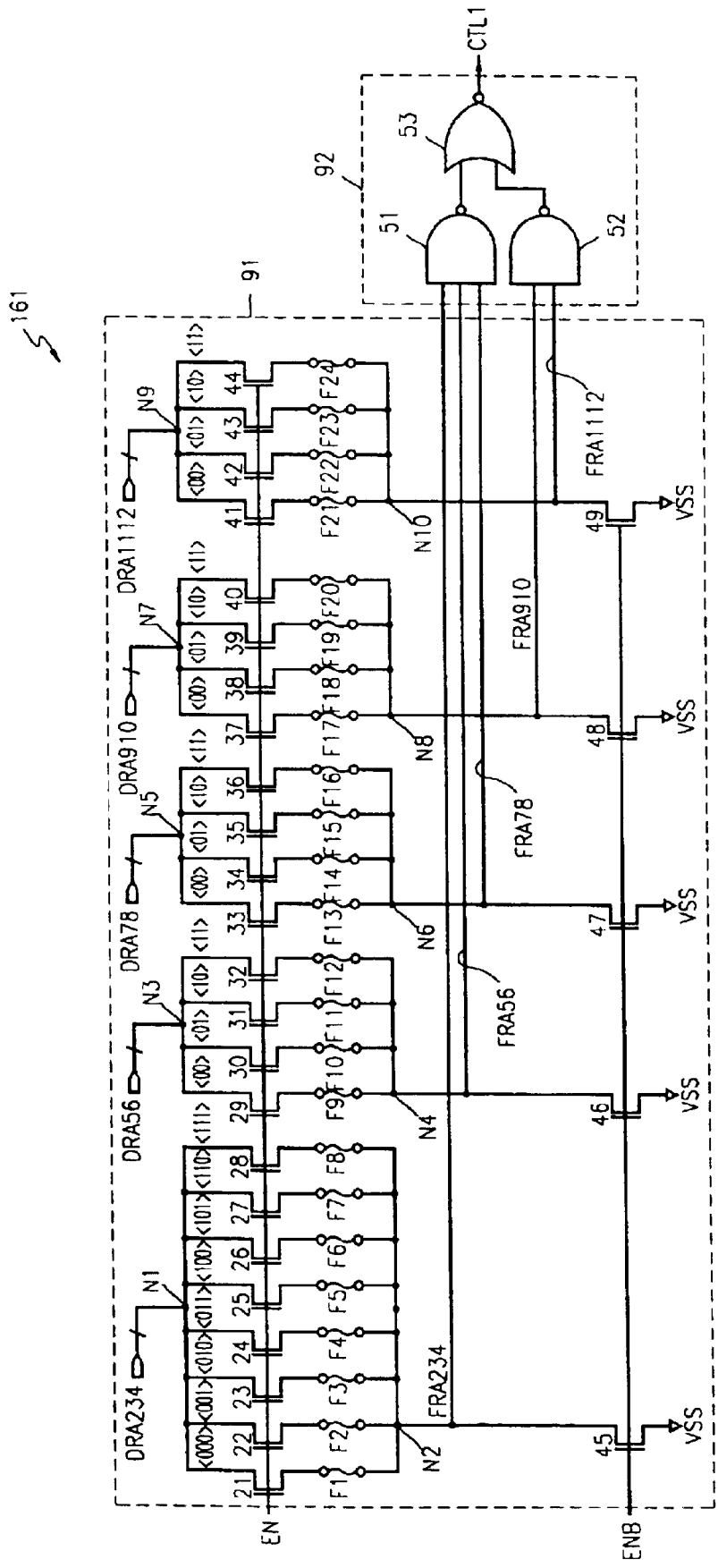
FIG. 2 is a circuit diagram of a first comparator of FIG. 1.
Figure 3:
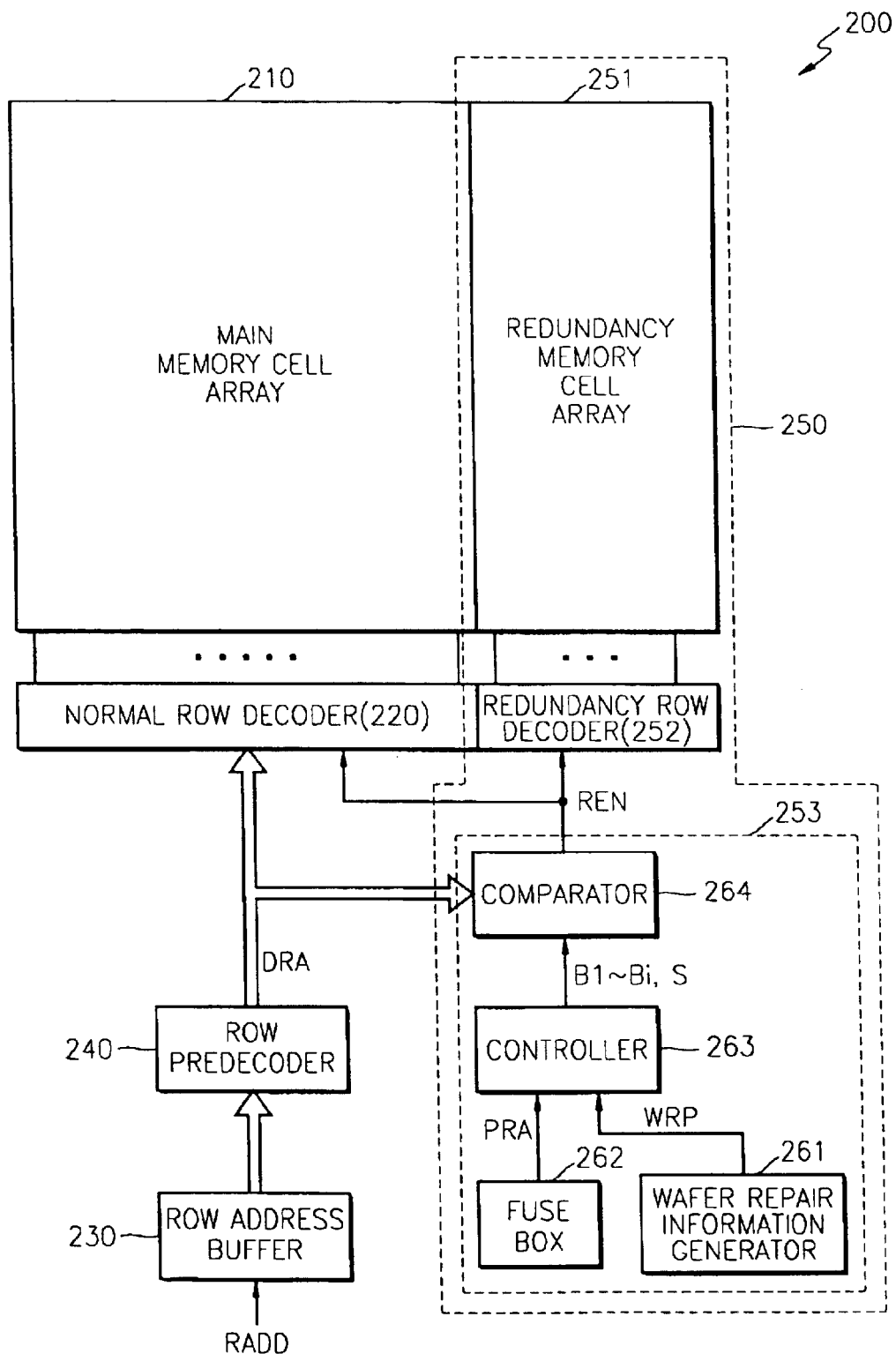
FIG. 3 is a block diagram of a semiconductor memory device with a repair apparatus that can be selectively programmed for a wafer-level test and a post package test, according to an embodiment of the present invention.

FIG. 3 is a block diagram of a semiconductor memory device 200 with a repair apparatus 250 that can be selectively programmed for a wafer-level test and a post package test, according to an embodiment of the present invention. In FIG. 3, illustration of some internal circuits in the semiconductor memory device 200 is omitted for convenience of illustration of the invention. The semiconductor memory device 200 includes a main memory cell array 210, a normal row decoder 220, a row address buffer 230, a row predecoder 240, and the repair apparatus 250. The main memory cell array 210 includes a plurality of memory cells (not shown) that are arranged in a matrix and store predetermined data. The row address buffer 230 receives an external row address signal RADD and transmits this signal to the row predecoder 240. The row predecoder 240 decodes the row address signal RADD and outputs a decoded address signal DRA. The normal row decoder 220 is enabled or disabled in response to a predetermined control signal REN. When the normal row decoder 220 is enabled, the decoded address signal DRA is decoded and a particular word line (not shown) of the main memory cell array 210 is selected and activated.

The repair apparatus 250 includes a redundancy memory cell array 251, a redundancy row decoder 252, and a repair control circuit 253. The repair control circuit 253 includes a wafer repair information generator 261, a fuse box 262, a controller 263, and a comparator 264. The redundancy row decoder 252 is enabled or disabled in response to the control signal REN. When the redundancy row decoder 252 is enabled, the normal row decoder is disabled.

When the redundancy row decoder 252 is enabled, a particular word line (not shown) of the redundancy memory cell array 251 is selected and activated, thus replacing a word line including a defective cell of the main memory cell array 210 with the particular word line of the redundancy memory cell array 251.

The wafer repair information generator 261 outputs a wafer repair signal WRP indicating whether the comparator 264 is programmed with an address signal for a defective cell, i.e., a first defective cell, which is detected during the wafer-level test. For instance, if the comparator 264 is programmed with the address signal for the first defective cell, the wafer repair information generator 261 enables the wafer repair signal WRP. If the comparator 264 is not programmed with the address signal, the wafer repair information generator 261 disables the wafer repair signal WRP.

The fuse box 262 includes a plurality of fuses (not shown) in which an address signal PRA for a defective cell, i.e., a second defective cell, which is detected during the post package test, is programmed. Here, the address signal PRA is programmed by selectively cutting the plurality of fuses. The plurality of fuses of the fuse box 262 may be embodied as laser fuses that are cut using a laser beam or electrical fuses that are electrically cut.

If the address signal PRA is programmed in the fuse box 262, the fuse box 262 is enabled during a repair operation of the repair apparatus 250. The fuse box 262 outputs the programmed address signal PRA for the second defective cell continuously during the repair operation of the repair apparatus 250. However, if the address signal PRA is not programmed in the fuse box 262, the fuse box 262 is disabled during the repair operation of the repair apparatus 250.

The controller 263 receives the wafer repair signal WRP from the wafer repair information generator 261 and receives the address signal PRA for the second defective cell from the fuse box 262. If the address signal PRA is not programmed in the fuse box 262, the controller 263 receives only the wafer repair signal WRP.

The controller 263 outputs a plurality of mode determination signals B1 through Bi that determine operation modes of the repair apparatus 250 and a repair enable signal S, in response to the wafer repair signal WRP and the address signal PRA. That is, the repair apparatus 250 operates to repair the first or second detective cell in response to the plurality of mode determination signals B1 through Bi and the repair enable signal S. Here, the repair apparatus 250 is set to repair only one of the first and second defective cells.

The comparator 264 receives the decoded row address signal DRA from the row predcoder 240. An address signal, for a defective cell, which is programmed in the comparator 264 is determined in response to the mode determination signals B1 through Bi and the repair enable signal S, this address signal being a signal compared with the decoded row address signal DRA. That is, in response to the mode determination signals B1 through Bi and the repair enable signal S, the address signal for the first defective cell or the address signal for the second defective cell is programmed in the comparator 264. The construction and operation of the comparator 264 in this connection will be later described in a greater detail with reference to FIG. 4. The comparator 264 compares the decoded row address signal DRA with the address signal for the first defective cell or the address signal PRA for the second defective cell, and outputs the control signal REN as the result of comparison.

Next, the operation of the repair apparatus 250 according to a preferred embodiment of the present invention will be described.

First, in case where the address signal for the first defective cell is programmed in the comparator 264, the wafer repair information generator 261 enables the wafer repair signal WRP. In this case, the fuse box 262 is disabled. The controller 263 enables the mode determination signals B1 through Bi and disables the repair enable signal S, in response to the wafer repair signal WRP. The comparator 264 compares the decoded row address signal DRA with the address signal for the first defective cell and outputs the control signal REN as the result of comparison, in response to the mode determination signals B1 through Bi and the repair enable signal S. The comparator 264 enables the control signal REN when the decoded row address signal DRA and the address signal for the-first defective cell are the same, and disables the control signal REN otherwise.

When the control signal REN is enabled, the redundancy row decoder 252 is enabled and the normal row decoder 220 is disabled. The redundancy row decoder 252 selects and activates a word line of the redundancy memory cell array 251, thus replacing a word line including a defective cell of the main memory cell array 210 with the word line of the redundancy memory cell array 251.

When the control signal REN is disabled, the redundancy row decoder 252 is disabled and the normal row decoder 220 is enabled, thus enabling normal operation of the main memory cell array 210.

If the address signal for the first defective cell is not programmed in the comparator 264, the wafer repair information generator 261 disables the wafer repair signal WRP. In this case, the address signal PRA for the second defective cell has already been programmed in the fuse box 262. The fuse box 262 is kept enabled during the repair operation of the repair apparatus 250 and outputs the address signal PRA for the second defective cell. The controller 263 partially enables the mode determination signals B1 through Bi and disables the repair enable signal S in response to the address signal PRA for the second defective cell and the wafer repair signal WRP. The address signal PRA for the second defective cell is programmed in the comparator 264 in response to the mode determination signals B1 and the repair enable signal S. The comparator 264 compares the decoded row address signal DRA with the address signal PRA for the second defective cell and outputs the control signal REN as the result of comparison. The subsequent operations of the repair apparatus 250 are as described above and therefore will be omitted here.

Figure 4:
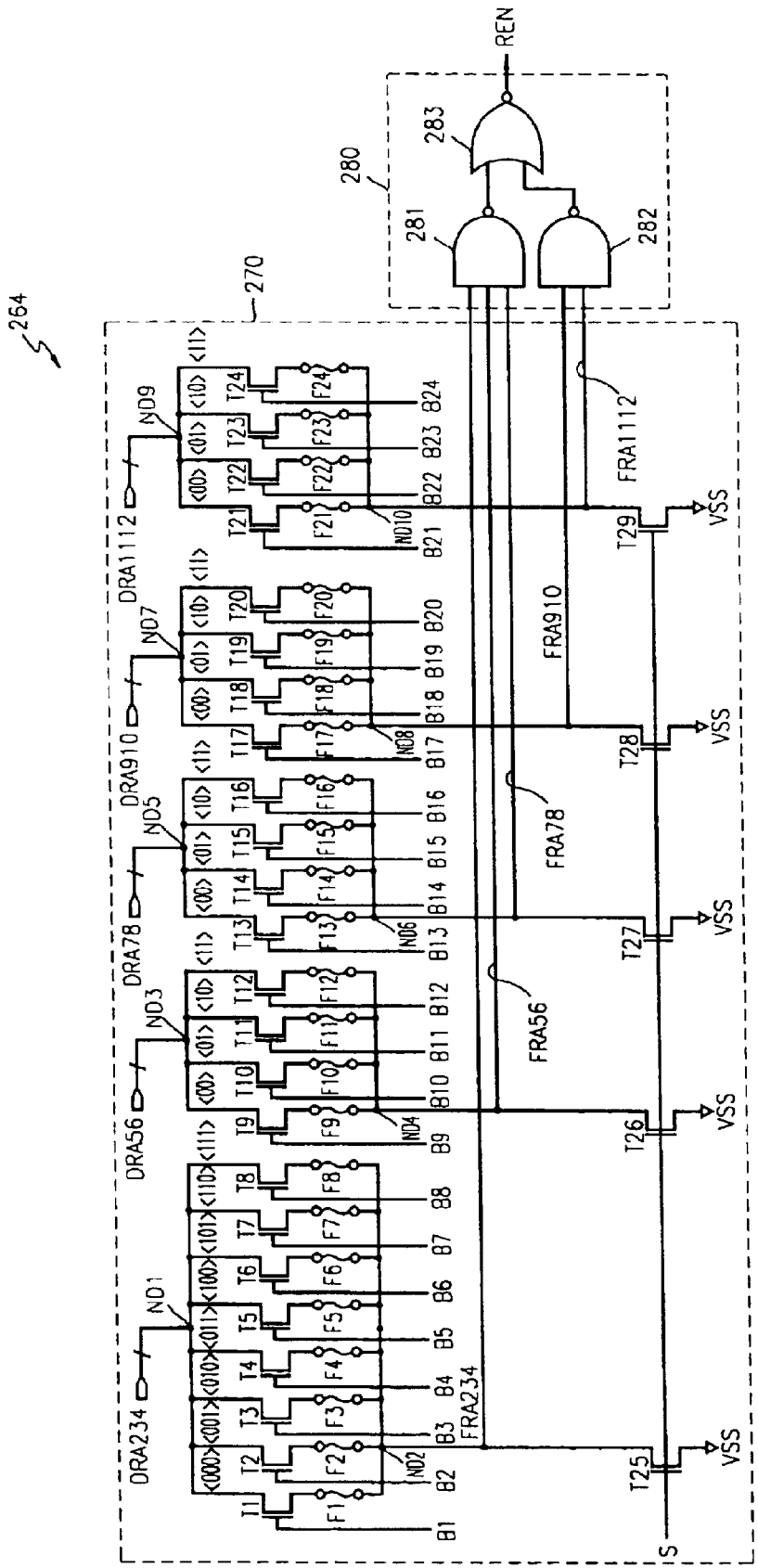
FIG. 4 is a circuit diagram of a comparator of FIG. 3, according to an embodiment of the present invention.

Next, the construction and operation of the comparator 264 will be described with reference to FIG. 4. FIG. 4 is a circuit diagram of the comparator 264 of FIG. 3, according to an embodiment of the present invention.

As shown in FIG. 4, the comparator 264 includes an address comparing circuit 270 and a logic circuit 280. The address comparing circuit 270 includes a plurality of transistors T1 through T29 and a plurality of fuses F1 through F24. The plurality of fuses F1 through F24 may be embodied as laser fuses that are cut using a laser beam or electrical fuses that are electrically cut. The transistors T1 through T24 are turned on or off in response to the mode determination signals B1 through B24, and the transistors T25 through T29 are turned on or off in response to the repair enable signal S. FIG. 4 illustrates that the address comparing circuit 270 includes the plurality of transistors T1 through T29 and a plurality of fuses F1 through F24. However, any further transistors and fuses may be added to the address comparing circuit 270 if necessary. In this case, the address comparing circuit 270 receives further mode determination signals, a total number of which is equivalent to that of fuses to be added. Also, the address comparing circuit 270 receives an additional decoded address signal DRA.

Drains of the transistors T1 through T8 are connected to a node ND1 and their sources are connected to a node ND2 via the fuses F1 through F8. Also, the mode determination signals B1 through B8 are input to gates of the transistors T1 through T8, respectively. The transistors T1 through T8 are turned on or off in response to the mode determination signals B1 through B8. The fuses F1 through F8 have been selectively cut based on the address signal for the first defective cell. In this case, the mode determination signals B1 through B8 are all enabled.

In the case where all of the fuses F1 through F8 are not cut, parts of the transistors T1 through T8 are turned on in response to the mode determination signals B1 through B8 that are partially enabled in response to the address signal PRA for the second defective cell. In this case, it is possible to obtain the same effect as when programming the address signal PRA for the second defective cell in the transistors T1 through T8 and the fuses F1 through F8.

The transistors T1 through T8 output an internal signal FRA234 at a high-level at the node ND2 when a decoded row address signal DRA234, which is received at the node ND1, is equivalent to the address signal for the first or second defective cell. If the decoded row address signal DRA234 is not equivalent to the address signal for the first or second defective cell, the transistors T1 through T8 output the internal signal FRA234 at a low level.

Drains of the transistors T9 through T12 are connected to a node ND3 and their sources are connected to a node ND4 via the fuses F9 through F12. Also, the mode determination signals B9 through B12 are input to gates of the transistors T9 through T12. The transistors T9 through T12 are turned on or off in response to the mode determination signals B9 through B12. The fuses F9 through F12 have been selectively cut based on the address signal for the first defective cell. In this case, the mode determination signals B9 through B12 are all enabled.

When all the fuses F9 through F12 are not cut, parts of the transistors T9 through T12 are turned on in response to the mode determination signals B9 through B12 that are partially enabled in response to the address signal PRA for the second defective cell. Therefore, it is possible to obtain the same effect as when the address signal PRA for the second defective cell is programmed in the transistors T9 through T12 and the fuses F9 through F12.

The transistors T9 through T12 output an internal signal FRA56 at a high level at the node ND4 when a decoded row address signal DRA56 is equivalent to the address signal for the first or second defective cell, the decoded row address signal DRA56 being received at the node ND3. If the decoded row address signal DRA56 is different from the address signal for the first or second defective cell, the transistors T9 through T12 output the internal signal FRA56 at a low level.

Drains of the transistors T13 through T16 are connected to a node ND5 and their sources are connected to a node ND6 via the fuses F13 through F16. Also, the mode determination signals B13 through B16 are input to gates of the transistors T13 through T16. The transistors T13 through T16 are turned on or off in response to the mode determination signals B13 through B16. The fuses F13 through F16 have been selectively cut based on the address signal for the first defective cell. In this case, the mode determination signals B13 through B16 are all enabled.

If all the fuses F13 through F16 are not cut, parts of the transistors T13 through T16 are turned on in response to the mode determination signals B13 through B16 that are partially enabled in response to the address signal PRA for the second defective cell. Therefore, it is possible to obtain the same effect as when programming the address signal PRA for the second defective cell in the transistors T13 through T16 and the fuses F13 through F16.

The transistors T13 through T16 output an internal signal FRA78 at a high level at the node ND6 when a decoded row address signal DRA78, which is received at the node ND5, is identical with the address signal for the first or second defective cell. If the decoded row address signal DRA78 is not identical with the address signal for the first or second defective cell, the transistors T13 through T16 output the internal signal FRA78 at a low level.

Drains of the transistors T17 through T20 are connected to a node ND7 and their sources are connected to a node ND8 via the fuses F17 through F20. Also, the mode determination signals B17 through B20 are input to gates of the transistors T17 through T20. The transistors T17 through T20 are turned on or off in response to the mode determination signals B17 through B20. The fuses F17 through F20 have been selectively cut based on the address signal for the first defective cell. In this case, the mode determination signals B17 through B20 are all enabled.

If all the fuses F17 through F20 are not cut, parts of the transistors T17 through T20 are turned on in response to the mode determination signals B17 through B20 that are partially enabled in response to the address signal PRA for the second defective cell. Therefore, it is possible to obtain the same effect as when programming the address signal PRA for the second defective cell in the transistors T17 through T20 and the fuses F17 through F20.

The transistors T17 through T20 output an internal signal FRA910 at a high level at the node ND8 when a decoded row address signal DRA910, which is received at the node ND7, is identical with the address signal for the first or second defective cell. If the decoded row address signal DRA910 is not identical with the address signal for the first or second defective cell, the transistors T17 through T20 output the internal signal FRA910 at a low level.

Drains of the transistors T21 through T24 are connected to a node ND9 and their sources are connected to a node ND10 via the fuses F21 through F24. Also, the mode determination signals B21 through B24 are input to gates of the transistors T21 through T24. The transistors T21 through T24 are turned on or off in response to the mode determination signals B21 through B24. The fuses F21 through F24 have been selectively cut based on the address signal for the first defective cell. In this case, the mode determination signals B21 through B24 are all enabled.

If all the fuses F21 through F24 are not cut, parts of the transistors T21 through T24 are turned on in response to the mode determination signals B21 through B24 that are partially enabled in response to the address signal PRA for the second defective cell. Therefore, it is possible to obtain the same effect as when programming the address signal PRA for the second defective cell in the transistors T21 through T24 and the fuses F21 through F24.

The transistors T21 through T24 output an internal signal FRA1112 at a high level at the node ND10 when a decoded row address signal DRA1112, which is received at the node ND9, is identical with the address signal for the first or second defective cell. If the decoded row address signal DRA1112 is not identical with the address signal for the first or second defective cell, the transistors T21 through T24 output the internal signal FRA1112 at a low level.

Drains of the transistors T25 through T29 are connected to the nodes ND2, ND4, ND6, ND8, respectively, and ND10 and their sources are connected to a ground voltage VSS. Also, the repair enable signal S is input to gates of the transistors T25 through T29. The transistors T25 through T29 are turned on or off in response to the repair enable signal S. The repair enable signal S is disabled when the repair apparatus 250 performs a repair operation and is enabled when the repair apparatus 250 does not perform a repair operation. When the repair enable signal S is enabled, the mode determination signals B1 through B24 are all disabled.

The logic circuit 280 outputs the control signal REN in response to the internal signals FRA234, FRA56, FRA78, FRA910, and FRA1112. The logic circuit 280 may be embodied as a combination of NAND gates 281 and 282 and an NOR gate 283. The NAND gate 281 performs a logic operation on the internal signals FRA234, FRA56, and FRA78 and outputs the result of the operation. The NAND gate 282 performs a logic operation on the internal signals FRA910 and FRA1112 and outputs the result of operation. The NOR gate 283 outputs the control signal REN in response to signals output from the NAND gates 281 and 282. If the address comparing circuit 270 includes further transistors and fuses, the logic circuit 280 may include additional NAND gates and NOR gates.

The operation of the comparator 264 will now be described.

First, a case where the address signal for the first defective cell is programmed in the fuses F1 through F24 of the address comparing circuit 270 will be described. In this case, the mode determination signals B1 through B24 are all enabled and the repair enable signal S is disabled.

As an example, a method of cutting the fuses F1 through F24 when the address signal for the first defective cell is equivalent to the decoded address signals DRA234<000>, DRA56<01>, DRA78<01>, DRA910<10>, and DRA1112<10> will be described.

First, since the decoded address signal DRA234 indicates <000>, the fuses F2 through F8 excluding the fuse F1 are cut. Next, since the decoded address signal DRA56 indicates <01>, the fuses F9, F11, and F12, except for the fuse F10, are cut. Next, since the decoded address signal DRA78 indicates <01>, the fuses F13, F15, and F16, except for the fuse F14, are cut. Since the decoded address signal DRA910 indicates <10>, the fuses F17 F18 and F20 except for the fuse F19, are cut. Since the decoded address signal DRA1112 indicates <10>, the fuses F21, F22, and F24, except for the fuse F23, are cut. In this case, all of the mode determination signals B1 through B24 are enabled, and thus, the transistors T1 through T24 are all turned on. If the input decoded address signals DRA234, DRA56, DRA78, DRA910, and DRA1112 are identical with the address signal for the first defective cell, the transistors T1, T10, T14, T19, and T23 are output the internal signals FRA234, FRA56, FRA78, FRA910, and FRA1112 at a high level, respectively. If the input decoded address signals DRA234, DRA56, DRA78, DRA910, and DRA1112 are not identical with the address signal for the first defective cell, the transistors T1, T10, T14, T19, and T23 are output the internal signals FRA234, FRA56, FRA78, FRA910, and FRA1112 at a low level, respectively.

The logic circuit 280 enables the control signal REN in response to the high-level internal signals FRA234, FRA56, FRA78, FRA910, and FRA1112, and disables the control signal REN in response to the low-level internal signals FRA234, FRA56, FRA78, FRA910, and FRA1112.

Second, a case where the address signal for the first defective cell is not programmed in the fuses F1 through F24, i.e., all of the fuses F1 through F24 are not cut, will now be described. In this case, in response to the mode determination signals B1 through B24, the address signal for the second defective cell, which is programmed in the fuse box 262 of FIG. 3 is programmed in the address comparing circuit 270. In this case, parts of the mode determination signals B1 through B24 are enabled and the repair enable signal S is disabled. More specifically, when the address signal for the second defective cell is equivalent to the decoded address signals DRA234<000>, DRA56<01>, DRA78<01>, DRA910<10>, and DRA1112<10>, the controller 263 of FIG. 3 enables the mode determination signals B1, B10, B14, B19, and B23 and disables the other mode determination signals B2 through B9, B11 through 13, B15 through B18, B21, B22, and B24.

The transistors T1, T10, T14, T19, and T23 are turned on in response to the mode determination signals B1, B10, B14, B19, and B23, respectively, and the transistors T2 through T9, T11 through T13, T15 through 18, T21, T22, and T24 are turned off in response to the mode determination signals B2 through B9, B11 through B13, B15 through B18, B21, B22, and B24, respectively. Accordingly, it is possible to obtain the same effect as when the address signal for the second defective cell is programmed in the address comparing circuit 270.

When the input decoded address signals DRA234, DRA56, DRA78, DRA910, and DRA1112 are identical with the address signal for the second defective cell, the transistors T1, T10, T14, T19, and T23 output the internal signals FRA234, FRA56, FRA78, FRA910, and FRA1112 at a high level. When the input decoded address signals DRA234, DRA56, DRA78, DRA910, and DRA1112 are not identical with the address signal for the second defective cell, the transistors T1, T10, T14, T19, and T23 output the internal signals FRA234, FRA56, FRA78, FRA910, and FRA1112 at a low level.

The logic circuit 280 enables the control signal REN in response to the high-level internal signals FRA234, FRA56, FRA78, FRA910, and FRA1112, and disables the control signal REN in response to the low-level internal signals FRA234, FRA56, FRA78, FRA910, and FRA1112.

In this disclosure, a process of repairing a row line including a defective cell of a main memory cell array using a repair apparatus according to a preferred embodiment of the present invention is described with reference to FIGS. 3 and 4. However, the present invention is not limited to this description, and it is possible to set the repair apparatus to repair a column line including the defective cell of the main memory cell array.

As described above, a repair control circuit of a repair apparatus according to the present invention can be programmed with one of an address signal for a defective cell detected during a wafer-level test and an address signal for a defective cell detected during a post package test. In other words, the repair apparatus can repair the defective cell detected during the wafer-level test or the post package test.

The repair apparatus according to the present invention includes a single redundancy memory cell array and does not occupy a large area in a semiconductor memory device. Therefore, it is possible to increase a total number of redundancy memory cells that repair defective cells in a small area of the semiconductor memory device.

Also, the repair apparatus according to the present invention is selectively repair a defective cell detected during the wafer-level test or a defective cell detected during the post package test. Therefore, paths of signals used to repair defective cells are the same, and thus, the repair apparatus does not require additional timing control.

While the present invention has been particularly shown and described with reference to the preferred embodiment thereof, the present invention is not restricted to the above embodiment. Further, it will be understood by those skilled in the art that various changes in form and details may be made without departing from the spirit and scope of the invention as defined by the appended claims.

What is claimed is:

1. A repair apparatus in a semiconductor memory device including a main memory cell array with a plurality of main memory cells, a predecoder which performs a first decoding operation on an external address signal, and a decoder which performs a second decoding operation on the address signal undergoing the first decoding operation and selects and activates parts of the plurality of main memory cells, the repair apparatus comprising:

a repair control circuit which programs one of an address signal for a first defective cell of the main memory cell array and an address signal for a second defective cell of the main memory cell array and outputs a control signal in response to the address signal undergoing the first decoding operation, the first defective cell being detected during a wafer-level test and the second defective cell being detected during a post package test;

a redundancy memory cell array which includes a plurality of redundancy memory cells and is activated to repair one of the first and second defective cells; and a redundancy decoder which is enabled or disabled in response to the control signal and is enabled to activate parts of the redundancy memory cells, wherein the decoder is disabled in response to the control signal when the redundancy decoder is enabled.

2. The repair apparatus of claim 1, wherein the repair control circuit comprises:

a wafer repair information generator which outputs a wafer repair signal indicating whether the programmed address signal of the first defective cell is present;

a fuse box which includes a plurality of first fuses and outputs the programmed address signal for the second defective cell, wherein the address signal for the second defective cell is programmed when parts of the first fuses are cut in response to an external program control signal;

a controller which outputs a plurality of mode determination signals and a repair enable signal in response to the wafer repair signal and the address signal for the second defective cell; and a comparator which determines one of the address signal for the first defective cell and the address signal for the second defective cell as a reference address signal in response to the plurality of mode determination signals and the repair enable signal, compares the address signal undergoing the first decoding operation with the reference address signal, and outputs the control signal as the result of comparison, wherein the fuse box is disabled and does not output the address signal for the second defective cell when the programmed address signal for the first defective cell is present.

3. The repair apparatus of claim 2, wherein the wafer repair information generator enables the wafer repair signal when the programmed address signal for the first defective cell is present and disables the wafer repair signal otherwise, and the controller enables all of the plurality of mode determination signals when the wafer repair signal is enabled, and enables parts of the plurality of mode determination signals in response to the address signal for the second defective cell, which is input from the fuse box, when the wafer repair signal is disabled.

4. The repair apparatus of claim 3, wherein the comparator comprises:

an address comparing circuit which outputs a plurality of internal signals when the address signal undergoing the first decoding operation is equivalent to the reference address signal; and a logic circuit which outputs the control signal in response to the plurality of internal signals.

5. The repair apparatus of claim 4, wherein the address comparing circuit comprises:

a plurality of second fuses connected in parallel;

a plurality of first switching circuits which are connected in series between inputs of the plurality of second fuses and an output of the predecoder, respectively; and a plurality of second switching circuits which are connected in series between outputs of the plurality of second fuses and a ground voltage, respectively.

6. The repair apparatus of claim 5, wherein the plurality of first switching circuits are turned on or off in response to the plurality of mode determination signals, the plurality of second switching circuits are turned on or off in response to the repair enable signal, and the plurality of second switching circuits are all turned off when all or parts of the first switching circuits are turned on.

7. The repair apparatus of claim 6, wherein parts of the plurality of second fuses are cut when all of the plurality of mode determination signals are enabled, and all of the plurality of second fuses are not cut when parts of the plurality of mode determination signals are enabled.

8. The repair apparatus of claim 1, wherein both the address signal for the first defective cell and the address signal for the second defective cell are row address signals.

9. The repair apparatus of claim 1, wherein both the address signal for the first defective cell and the address signal for the second defective cell are column address signals.

10. A semiconductor memory device including the repair apparatus of claim 1.

11. A repair method using a repair apparatus including a repair control circuit which programs one of an address signal for a first defective cell detected during a wafer-level test and an address signal for a second defective cell detected during a post package test and outputs a control signal in response to a decoded address signal input from a predecoder, a redundancy memory cell array which includes a plurality of redundancy memory cells, and a redundancy decoder which activates parts of the redundancy memory cells in response to the control signal, the repair method comprising:

(a) determining whether an address signal programmed in the repair control circuit is the address signal for the first defective cell;

(b) comparing the decoded address signal with the address signal for the first defective cell and outputting the control signal as the result of the comparison when the address signal for the first defective cell is programmed in step (a);

(c) comparing the decoded address signal with the address signal for the second defective cell and outputting the control signal as the result of the comparison when the address signal for the first defective cell is not programmed in step (a); and (d) enabling the redundancy decoder and activating parts of the plurality of redundancy memory cells when the control signal is enabled.

12. The repair method of claim 11, wherein step (b) further comprises:

(b1) enabling all of the plurality of mode determination signals;

(b2) determining that the address signal for the first defective cell as a reference address signal, which is compared with the decoded address signal, in response to the plurality of mode determination signals;

(b3) comparing the address signal for the first defective signal with the decoded address signal; and (b4) enabling the control signal when it is determined in step (b3) that the address signal for the first defective cell is equivalent to the decoded address signal.

13. The repair method of claim 11, wherein step (c) further comprises:

(c1) enabling parts of the plurality of mode determination signals in response to the address signal for the second defective cell;

(c2) determining the address signal for the second defective cell as a reference address signal, which is compared with the decoded address signal, in response to the plurality of mode determination signals;

(c3) comparing the address signal for the second defective cell with the decoded address signal; and (c4) enabling the control signal when it is determined in step (c3) that the address signal for the second defective cell is equivalent to the decoded address signal.

14. The repair method of claim 11, wherein both the address signal for the first defective cell and the address signal for the second defective cell are row address signals.

15. The repair method of claim 11, wherein both the address signal for the first defective cell and the address signal for the second defective cell are column address signals.

* * * * *